United States Patent [19]

Baeger

[11] Patent Number: 4,746,198
[45] Date of Patent: May 24, 1988

[54] DEVICE FOR AN ELECTRICALLY CONDUCTIVE CONNECTION BETWEEN A LIQUID CRYSTAL CELL AND CIRCUIT BOARD

[75] Inventor: Holm Baeger, Schwalbach a. T., Fed. Rep. of Germany

[73] Assignee: VDO Adolf Schindling AG, Frankfurt am Main, Fed. Rep. of Germany

[21] Appl. No.: 62

[22] Filed: Jan. 2, 1987

[30] Foreign Application Priority Data

Feb. 7, 1986 [DE] Fed. Rep. of Germany ....... 3603819

[51] Int. Cl.$^4$ ............................................... G02F 1/13
[52] U.S. Cl. .................................... 350/336; 350/332; 350/334; 350/345
[58] Field of Search ................ 350/334, 345, 332, 336

[56] References Cited

U.S. PATENT DOCUMENTS

| | | | |
|---|---|---|---|
| 3,718,842 | 2/1973 | Abbott et al. | 350/334 X |
| 4,165,607 | 8/1979 | Fedorowicz et al. | 350/334 X |
| 4,422,728 | 12/1983 | Andreaggi | 350/334 |
| 4,514,042 | 4/1985 | Nukii et al. | 350/334 X |
| 4,614,406 | 9/1986 | Motoi | 350/334 |

Primary Examiner—Stanley D. Miller
Assistant Examiner—Richard Gallivan
Attorney, Agent, or Firm—Martin A. Farber

[57] ABSTRACT

In a device for the electrically conductive connection of a liquid-crystal cell to a circuit board, the liquid-crystal cell and the circuit board are substantially perpendicular to each other and have conductive paths which fit each other, the conductive paths being connected to each other by solder within an angle formed by them. A slot can be provided in an edge region of the circuit board in order to receive an edge region of the liquid-crystal cell.

12 Claims, 1 Drawing Sheet

DEVICE FOR AN ELECTRICALLY CONDUCTIVE CONNECTION BETWEEN A LIQUID CRYSTAL CELL AND CIRCUIT BOARD

FIELD AND BACKGROUND OF THE INVENTION

The present invention relates to a device for the electrically conductive connecting of a liquid-crystal cell to a printed circuit board.

Various devices are already known for connecting a liquid-crystal cell to a printed circuit board which bears, in particular, a control circuit. One such device which is frequently used contains a conductive gum -- also known as zebra stripes. This conductive gum is in the shape of a bar of rectangular cross section and consists of a plurality of disks which fill up its cross section, an insulating disk and a conductive disk alternating with each other. A continuous insulating layer can then be applied on two opposite sides.

These conductive gums have in fact found wide use. However, the reliability and permanence of such contacts still needs improvement. Furthermore, conductive gums have been known solely for connecting conductive paths which are arranged on parallel boards arranged facing each other.

For reasons of construction it may, however, be advantageous to arrange the circuit board at right angles to the liquid-crystal cell. Particularly in the case of liquid-crystal cells with negative display of the characters and symbols, illumination from the rear is advantageous and, for this purpose, a structural shape with circuit board and liquid-crystal cell at right angles to each other is desirable.

For the connecting of circuit boards which are at right angles to each other, various multiple-plug devices have, it is true, become known but they are more subject to corrosion than contacting by means of conductive gum because of the lack of protection of the contacts. Furthermore, such multiple-plug connections are relatively expensive and are not available for such a small spacing between contacts as is required for connecting liquid-crystal cells, particularly dot matrix displays, to the control electronics.

SUMMARY OF THE INVENTION

It is an object of the present invention to provide a device by which a dependable, economical connection between a liquid-crystal cell and a circuit board is made possible.

According to the invention, an edge region of the liquid-crystal cell (4) which bears the conductive paths and the circuit board (1) are substantially perpendicular to each other and have conductive paths (5, 6) which are perpendicular to each other and are soldered together within the angle formed by them. The device in accordance with the invention has the advantage that dependable contact is maintained for a long period of time, even in a corrosive atmosphere. Furthermore, the device is economical to manufacture.

A first further development of the invention is characterized by the fact that a slot (2) is arranged in the region of an edge of the circuit board (1) in order to receive the edge region (3) of the liquid-crystal cell. In this way, the liquid-crystal cell can be inserted into the circuit board in the same way as other components and can be soldered, for instance, by machine with a flow-soldering bath or else by hand in traditional manner.

Another further development of the invention is characterized by the fact that a plurality of slots (19, 20, 21) are arranged in a row in the circuit board and that the liquid-crystal cell (4) is provided in the region of its edge (3) with cutouts (23, 24) which correspond to the spaces between the slots in the circuit board. As a result of this feature, particularly in the case of long liquid-crystal cells, the strength of the connection between the liquid-crystal cell and the circuit board is increased. If this is not necessary in the specific case for the reason, for instance, that the liquid-crystal cell and the circuit board are also otherwise mechanically connected to each other, then, in accordance with another feature, the slot (14) can be partially open towards the edge.

In accordance with another development, the conductive paths (6) of non-solderable material in the edge region (3) of the liquid-crystal cell (4) are provided with a solderable layer which consists preferably of copper (33). Furthermore, the conductive paths (6) of the liquid-crystal cell (4) may be of indium-tin oxide.

Advantageous embodiments of the invention consist in arranging on the circuit board (1) electrical components (10) and particularly a control circuit for the liquid-crystal cell (4), one or more lamp sockets for the illuminating of the liquid-crystal cell and/or a light box which forms a reflector, and soldering their terminals to the conductive paths (5) of the circuit boards (1).

Still further, a light box (8) can be connected to the circuit board (1).

Finally, it is possible to connect each of two opposite edge regions (26, 27) of the liquid-crystal cell (28) to respective circuit boards (29, 30), which is advantageous, in particular, where there are a large number of terminals of the liquid-crystal cell, and leads to a particularly compact assembly.

The invention is not limited to a rigid circuit board; a flexible sheet with conductive paths applied to it can also be used.

Still further, the liquid-crystal cell (4, 28) and the circuit board (1, 29, 30) are connected to each other by a sealing compound and/or by soldering, in addition to the contacting.

The invention permits of numerous embodiments.

BRIEF DESCRIPTION OF THE DRAWINGS

With the above and other objects and advantages in view, the present invention will become more clearly understood in connection with the detailed description of preferred embodiments, when considered with the accompanying drawings, of which.

Identical parts are provided with the same reference numbers in the figures.

DETAILED DESCRIPTION OF THE PREFERRED EMBODIMENTS

Figure 1:
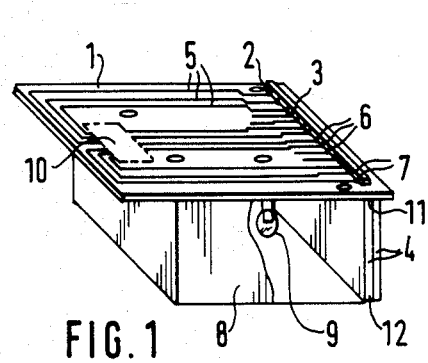
FIG. 1 is a first embodiment of the invention, seen in perspective.

In the arrangement shown in FIG. 1, a circuit board 1 is provided with a slot 2 into which an edge region 3 of a liquid-crystal cell 4 is inserted. The conductive paths 5, 6 of the circuit board 1 and of the liquid-crystal cell 4 which are to be connected together form in each case an angle with each other, which angle is filled with solder 7 upon the passage of a flow-solder bath. In this way, an electrically conductive as well as mechanically strong connection is established between the liquid-crystal cell 4 and the circuit board 1. Aside from the liquid-crystal cell 4 there are also present on the circuit board 1 a light box 8, a lamp 9 and an integrated circuit 10 which serves for controlling the liquid-crystal cell 4. The terminals of the integrated circuit 10 and of the lamp 9 or its socket are inserted in customary manner into the circuit board 1 and soldered to conductive paths on the bottom of the board. The light box 8, which does not require any electrical connection, can also be held by the soldering if the projections 11 of the light box 8 which are inserted in corresponding holes in the circuit board are provided with a solderable coating.

Figure 2:
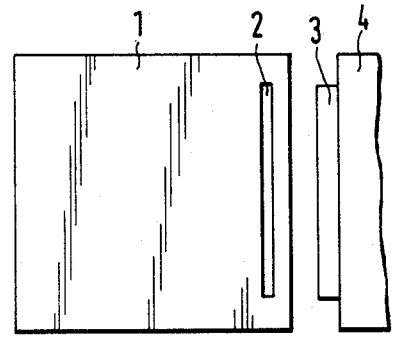
FIG. 2 shows the circuit board and a part of the liquid-crystal cell of the first embodiment.

FIG. 2 once again shows the circuit board 1 and the edge region 3 of the liquid-crystal cell 4 in strongly simplified fashion. In the embodiment shown in FIGS. 1 and 2, the edge region 3 of the liquid-crystal cell 4 which fits the slot 2 is kept somewhat narrower than the liquid-crystal cell 4 itself. As a result, the sides of the liquid-crystal cell 4 and of the circuit board 1 lie in the same plane. Furthermore, the shoulders formed thereby can serve for the additional supporting of the liquid-crystal cell on the circuit board, which is already effected by an edge 11 of the second board 12 of the liquid-crystal cell 4.

Figure 3:
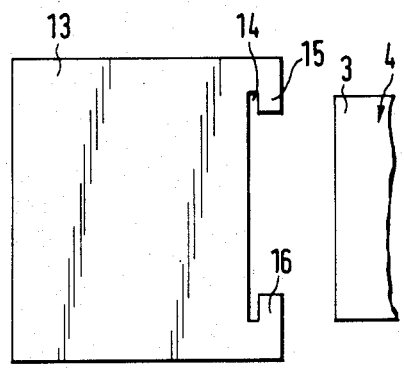
FIG. 3 shows a circuit board and a part of a liquid-crystal cell of a second embodiment.

In the case of the circuit board 13 shown in FIG. 3, the slot 14 is open towards the edge. Only the hook-shaped parts 15 and 16 as well as the solder hold the liquid-crystal cell 4 on the circuit board 13. Advantages can result from this, depending on the design requirements. A connection between the liquid-crystal cell and the circuit board in which no slot is present, merely an edge region of the circuit board serving for the connection, may be advantageous in the specific case.

Figure 4:
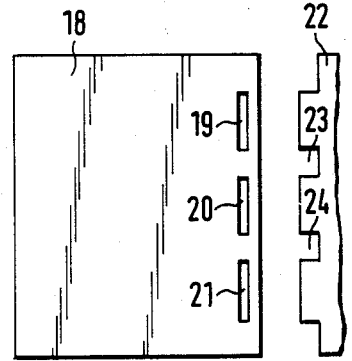
FIG. 4 shows a circuit board and a part of a liquid-crystal cell of a third embodiment.

In the embodiment shown in FIG. 4, a circuit board 18 is provided with a plurality of slots 19, 20, 21 located in a row. The liquid-crystal cell 22 has cutouts 22, 24 which fit the webs present between the slots 19, 20, 21. As compared with the arrangement shown in FIG. 2, although in the arrangement of FIG. 3 there is less length of the liquid-crystal cell available for the contacting, nevertheless greater mechanical strength is obtained by the webs present between the slots 19, 20, 21. The extensions which fit into the slots 19 and 21 can also serve merely for adjustment or else as additional fastening if the contacts can be arranged on the central extension. Soldering of the extensions into the corresponding metalized slots 19 and 21 could relieve the contacts from mechanical stresses, as is particularly advantageous in the case of large liquid-crystal cells. Larger liquid-crystal cells can also be held in place by means of sealing compounds.

Figure 5:
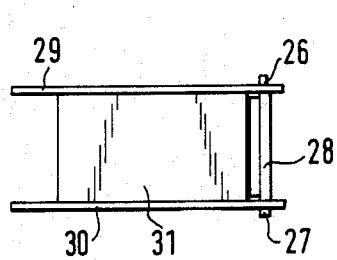
FIG. 5 shows a fourth embodiment.

In the arrangement shown in FIG. 5, two opposite edge regions 26, 27 of a liquid-crystal cell are inserted into corresponding slots of two circuit boards 29, 30 and connected to the conductive paths by soldering. The connecting of a light box 31 to two circuit boards 29, 30 is effected in the same manner. In this way, a very compact and stable assembly is obtained.

Figure 6:
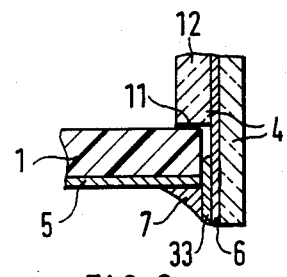
FIG. 6 is a cross-sectional, enlarged showing of a connection between a liquid-crystal cell and a circuit board.

FIG. 6 shows, on a larger scale, the solder connection between a conductive path 6 of a liquid-crystal cell 4 and a conductive path 5 of a circuit board 1. The conductive path 6 of the liquid-crystal cell is in this case provided at its end region with a solderable layer 33 and the solder 7 fills the angle between the conductive paths 5 and 6 in known manner. The application of a solderable layer to indium-tin oxide is known per se and need not be described in further detail in connection with the present invention. In addition to copper, other metals are also suitable for this.

The invention is not limited to the embodiments shown but can be reduced to practice in many ways. Thus it is possible, for instance, to arrange the liquid-crystal cell 4 at an angle of other than 90 to the circuit board, should this be advantageous. This might be the case upon the installation of the liquid-crystal cell 4 and the circuit board 1 in a beveled housing or in the dashboard of an automobile.

I claim:

1. A device providing an electrically conductive connection of a liquid-crystal cell to a printed circuit board, the device comprising
   means for orienting the liquid-crystal cell and the circuit board substantially perpendicularly to each other, said cell and said board each having conductive paths, said conductive paths being perpendicular to each other; and
   means for connecting together the conductive paths of said cell with corresponding ones of the conductive paths of said board, said connecting means including solder disposed within an angle formed by the conducting paths.

2. The device according to claim 1, wherein
   said orienting means comprises a slot located in a region of an edge of said circuit board, said slot being configured to receive an edge region of said liquid-crystal cell.

3. The device according to claim 2, wherein
   said slot is partially open towards the edge of said circuit board.

4. The device according to claim 1, wherein said orienting means comprises
   a plurality of slots arranged in a row and separated by webs in said circuit board; and
   cutouts formed in a region of an edge of said liquid-crystal cell, which cutouts correspond to locations of the webs formed between the slots.

5. The device according to claim 1, wherein
   the conductive paths of said liquid crystal cell comprise non-solderable material, said connecting means comprising a solderable layer located on each of the conductive paths of the non-solderable material in an edge region of the liquid-crystal cell.

6. The device according to claim 5, wherein
   said solderable layer is made of copper; and
   the conductive paths of said liquid-crystal cell comprise indium-tin oxide.

7. The device according to claim 1, wherein
   said orienting means and said connecting means are operative in the presence of electrical components, particularly a control circuit for the liquid-crystal cell, located on said circuit board.

8. The device according to claim 7, wherein said electrical components include at least one lamp located on said circuit board for illuminating said liquid-crystal cell, terminals of the lamp being soldered to the conductive paths of the circuit board.

9. The device according to claim 7, wherein said electrical components include a light box connected to said circuit board.

10. The device according to claim 1, wherein said circuit board is formed from a flexible foil.

11. The device according to claim 1, wherein said orienting means and said connecting means are operative further with a second circuit board, said liquid crystal cell having two opposite edge regions connected to respective ones of said circuit boards.

12. The device according to claim 1, wherein said connecting means provides for a connection of said liquid-crystal cell and said circuit board to each other by a sealing compound and/or by soldering, in addition to a contacting of said respective conductive paths.

* * * * *